(12) United States Patent
Duval

(10) Patent No.: US 11,984,155 B2
(45) Date of Patent: *May 14, 2024

(54) UPDATING PROGRAM FILES OF A MEMORY DEVICE USING A DIFFERENTIAL WRITE OPERATION

(71) Applicant: Micron Technology, Inc., Boise, ID (US)

(72) Inventor: Olivier Duval, Pacifica, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/050,810

(22) Filed: Oct. 28, 2022

(65) Prior Publication Data

US 2023/0078377 A1  Mar. 16, 2023

Related U.S. Application Data

(63) Continuation of application No. 17/307,647, filed on May 4, 2021, now Pat. No. 11,508,433, which is a
(Continued)

(51) Int. Cl.
*G11C 11/413* (2006.01)
*G06F 8/658* (2018.01)
(Continued)

(52) U.S. Cl.
CPC .......... *G11C 11/413* (2013.01); *G06F 8/658* (2018.02); *G11C 7/065* (2013.01); *G11C 7/1096* (2013.01); *G11C 8/16* (2013.01)

(58) Field of Classification Search
CPC .......... G11C 11/413; G11C 7/065; G11C 8/16; G11C 7/1096; G06F 8/658
See application file for complete search history.

(56) References Cited

U.S. PATENT DOCUMENTS 8,547,201 B2  10/2013  Katayama et al.
2007/0143530 A1  6/2007  Rudelic et al.
(Continued)

FOREIGN PATENT DOCUMENTS

CN   102282799 A   12/2011
CN   105511920 A    4/2016
CN   108710500 A   10/2018

OTHER PUBLICATIONS

China National Intellectual Property Administration, "First Office Action," issued in connection with Chinese Patent Application No. 202010863511.1, dated Aug. 11, 2021 (8 pages).
(Continued)

*Primary Examiner* — Ajay Ojha
(74) *Attorney, Agent, or Firm* — Holland & Hart LLP

(57) ABSTRACT

Methods, systems, and devices for a differential write operation are described. The operations described herein may be used to alter a portion of a program file from a first state to a second state. For example, a file (e.g., a patch file) that is associated with a signature may be received at a memory device. Based on an authentication process, the file may be used to alter the program file to the second state. In some examples, the program file may be altered to the second state using a buffer of the memory device. A host system may transmit a file that includes the difference between the first state and the second state. A signature may be associated with the file and may be used to authenticate the file.

20 Claims, 6 Drawing Sheets

Related U.S. Application Data continuation of application No. 16/551,567, filed on Aug. 26, 2019, now Pat. No. 11,017,846.

(51) Int. Cl.
*G11C 7/06* (2006.01)
*G11C 7/10* (2006.01)
*G11C 8/16* (2006.01)

(56) References Cited

U.S. PATENT DOCUMENTS

2018/0307479 A1 10/2018 Subramanian et al.
2019/0155598 A1 5/2019 Bainville et al.

OTHER PUBLICATIONS

Notice of Allowance received for Chinese Patent Application No. 202010863511, dated Feb. 17, 2022, 4 pages.

UPDATING PROGRAM FILES OF A MEMORY DEVICE USING A DIFFERENTIAL WRITE OPERATION

CROSS REFERENCE

The present application for patent is a continuation of U.S. patent application Ser. No. 17/307,647 by Duval et al., entitled "UPDATING PROGRAM FILES OF A MEMORY DEVICE USING A DIFFERENTIAL WRITE OPERATION," filed May 4, 2021, which is a continuation of U.S. patent application Ser. No. 16/551,567 by Duval entitled "UPDATING PROGRAM FILES OF A MEMORY DEVICE USING A DIFFERENTIAL WRITE OPERATION," filed Aug. 26, 2019, each of which is assigned to the assignee hereof, and is expressly incorporated by reference in its entirety herein.

BACKGROUND

The following relates generally to a system that includes at least one memory device and more specifically to differential write operation.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

Improving memory devices, generally, may include increasing memory cell density, increasing read/write speeds, increasing reliability, increasing security, increasing data retention, reducing power consumption, decreasing stress on a memory cell, or reducing manufacturing costs, among other metrics.

DETAILED DESCRIPTION

Figure 1:
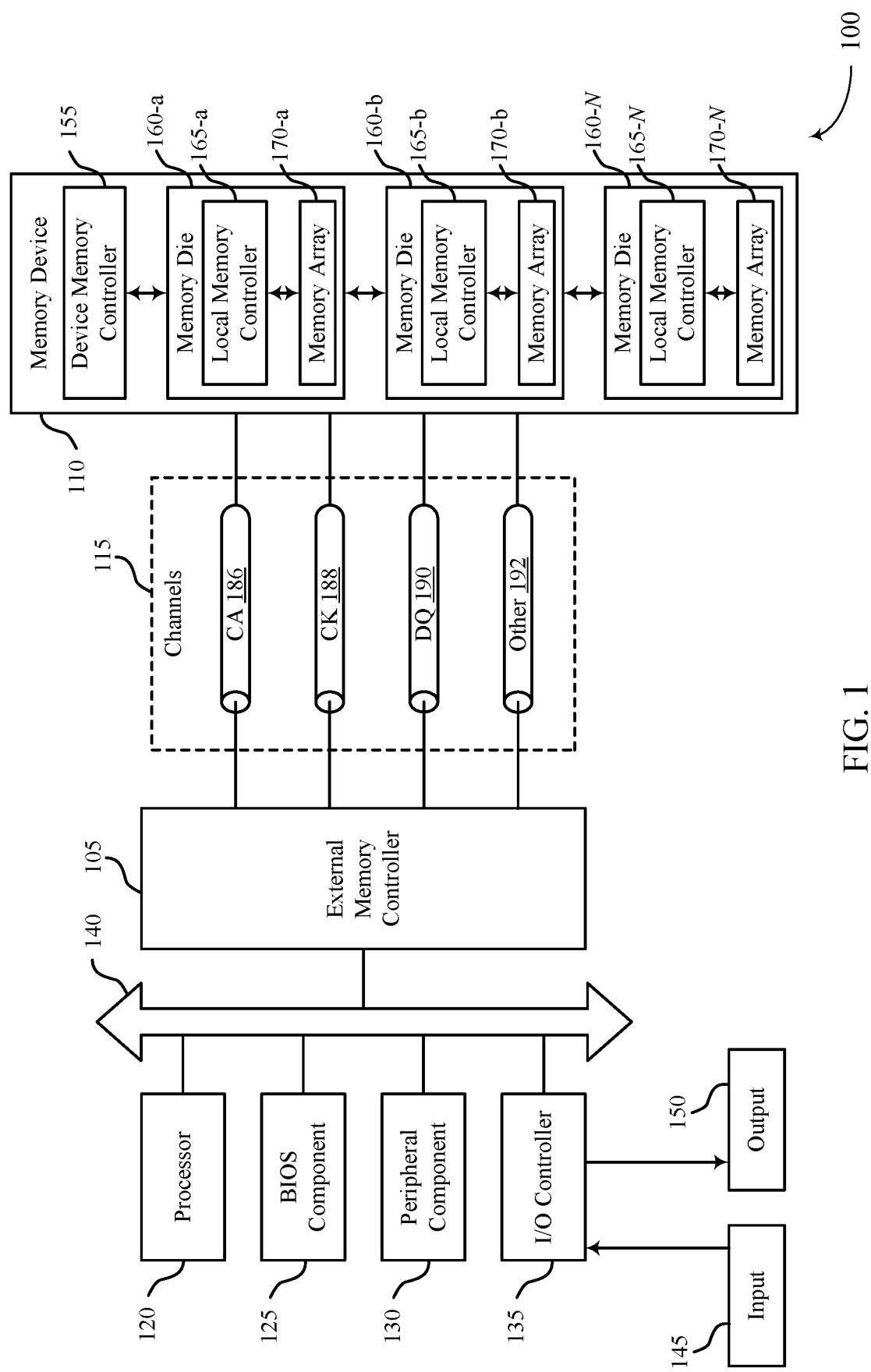
FIG. 1 illustrates an example of a system that supports a differential write operation in accordance with examples as disclosed herein.

Memory devices may include certain files (e.g., program files) that may be updated periodically. Software updates may be performed on computer systems (e.g., on program files stored on computer systems) to add new features or remove bugs found after deployment of a particular program. Some of these updates may be examples of over-the-air (OTA) software updates. These software updates are commonly provided to a computer system by a known user (e.g., a known system). However, because software updates are typically performed by a central processing unit (CPU) of the memory device, software updates may place the computer system at risk for a backdoor attack. For example, attackers may modify the update to grant the attackers access to the computing system after the update is complete. An unauthorized user that gains access to the computing system may deploy a malicious program (e.g., a virus) or steal data stored on the computing system or that passes through the computing system.

Additionally or alternatively, some program files stored at a memory device may be required for the computer system to boot, and software updates on these program files may potentially prevent the computer system from booting, thus rendering the device inoperable (e.g., bricking the device). One way a software update sequence could result in such an outcome is in case a power loss event occurs at any point during the update sequence, leaving the program file only partially modified. Accordingly, a method and/or system for deploying software updates securely in order to minimize or mitigate backdoor attacks may be beneficial. Additionally or alternatively, a power-loss-tolerant software update mechanism may resume or revert the update after a power loss event, which may ensure that the memory device contains valid program files.

The methods and systems described herein allow for program files to be securely updated, thus minimizing or mitigating any potential backdoor attacks on the system while the update is being performed. In some examples, a secure update may occur using a differential update, where the update pertains to only the portion of the program file that needs updating. The differential update may include (or be associated with) one or more signatures that may be generated external to the computing device. Thus the signatures may be secret or unknown to the computing device. The computing device may be configured to generate its own signature, which may be used to authenticate the update (i.e., a patch file associated with the update that is provided to the computing device). If authenticated, the update may be applied to the program file. Alternatively, if the update is not authenticated, the update may either not be installed or the program file may be reverted to a prior state to ensure that it is running safely and securely. By authenticating the update prior to its installation, backdoor attacks on the computing system may be minimized or mitigated.

In some cases, differential updates may use less processing resources and a lesser amount of storage space (e.g., than updates using a full backup of the program file) due to the differential update only updating a portion of the program file (e.g., a portion of the program file that need updating). Accordingly, the methods and systems described herein may incorporate a buffer (e.g., a write block buffer (WBB)) of the memory device to perform the update. Based on the update being authenticated, the patch file may be updated and applied to the program file, which may simplify the design of the update and thus reduce the amount of data transferred to the memory device and memory resources otherwise dedicated to using a full backup of the program file. Differential updates may eliminate (or reduce) the need for backup memory resources otherwise needed to store large program files. Eliminating or reducing the need for backup memory resources may increase the effective density of the memory device.

As described herein, a series of commands may be exchanged between a device issuing an update (e.g., a host device) and the memory device. The commands may be issued to reserve a portion of the WBB for storing the patch file and associated signature(s), to provide the patch file and associated signature(s) to the memory device, to execute the update, and/or to request a status update regarding the most-recent update. Utilizing the command structure described herein may allow for updates to be securely provided to a computing system, which may simplify the design of update systems, increase the effective density of memory devices, and may minimize or mitigate backdoor attacks on a system.

Features of the disclosure are initially described in the context of a memory system as described with reference to FIG. 1. Features of the disclosure are described in the context of a process flow diagram and block diagram as described with reference to FIGS. 1 and 3. These and other features of the disclosure are further illustrated by and described with reference to flowcharts that relate to differential write operation as described with references to FIGS. 4-6.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card. In some examples, the host device 105 may be configured to transmit one or more commands to the memory device 110 for performing an update on a program file. In some examples, the program file may be stored to the memory device 110 and a portion of the program file may be updated based on a command transmitted from the host device 105. In some examples, the command may include a patch file for updating the program file, and may include a difference between a first state and a second state of the program file (i.e., the patch file may be configured to update the program file from a first state to a second state). The command may also include a signature associated with the patch file. The memory device 110 may be configured to generate its own signature, and may authenticate the command based on the signatures matching. In some examples, the program file may be altered (e.g., updated) from the first state to the second state based on the authentication.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (e.g., including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK t signal and a CK c signal) and the signal paths of the CK channels 188 may be configured accordingly. In some cases, the clock signal may be single ended. A CK channel 188 may include any quantity of signal paths. In some cases, the clock signal CK (e.g., a CK t signal and a CK c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, the memory device 110 may support a differential write operation, which may allow for updates to be securely provided to a computing system, which may simplify the design of update systems and may minimize or mitigate backdoor attacks on a system. During a portion of the write operation, the memory device 110 may receive one or more commands to reserve a portion of a buffer (e.g., a WBB) for storing a patch file and associated signature(s), to write the patch file and associated signature(s) to the buffer, and to execute the patch file in order to alter (e.g., update) the program file from a first state to a second state. In some examples, one or more authentication processes may be performed by the memory device 110 to authenticate the patch file, the command transmitted from the host device 105 to the memory device, and/or the updated state of the program file (e.g., to verify that the patch file was executed properly). In some examples, the memory device 110 may provide a status update to the host device 105 to indicate whether the patch file was executed properly or improperly. If executed improperly, the memory device 110 may be configured to revert the program file to a prior state to prevent errors from occurring due to the program file being updated improperly.

Figure 2:
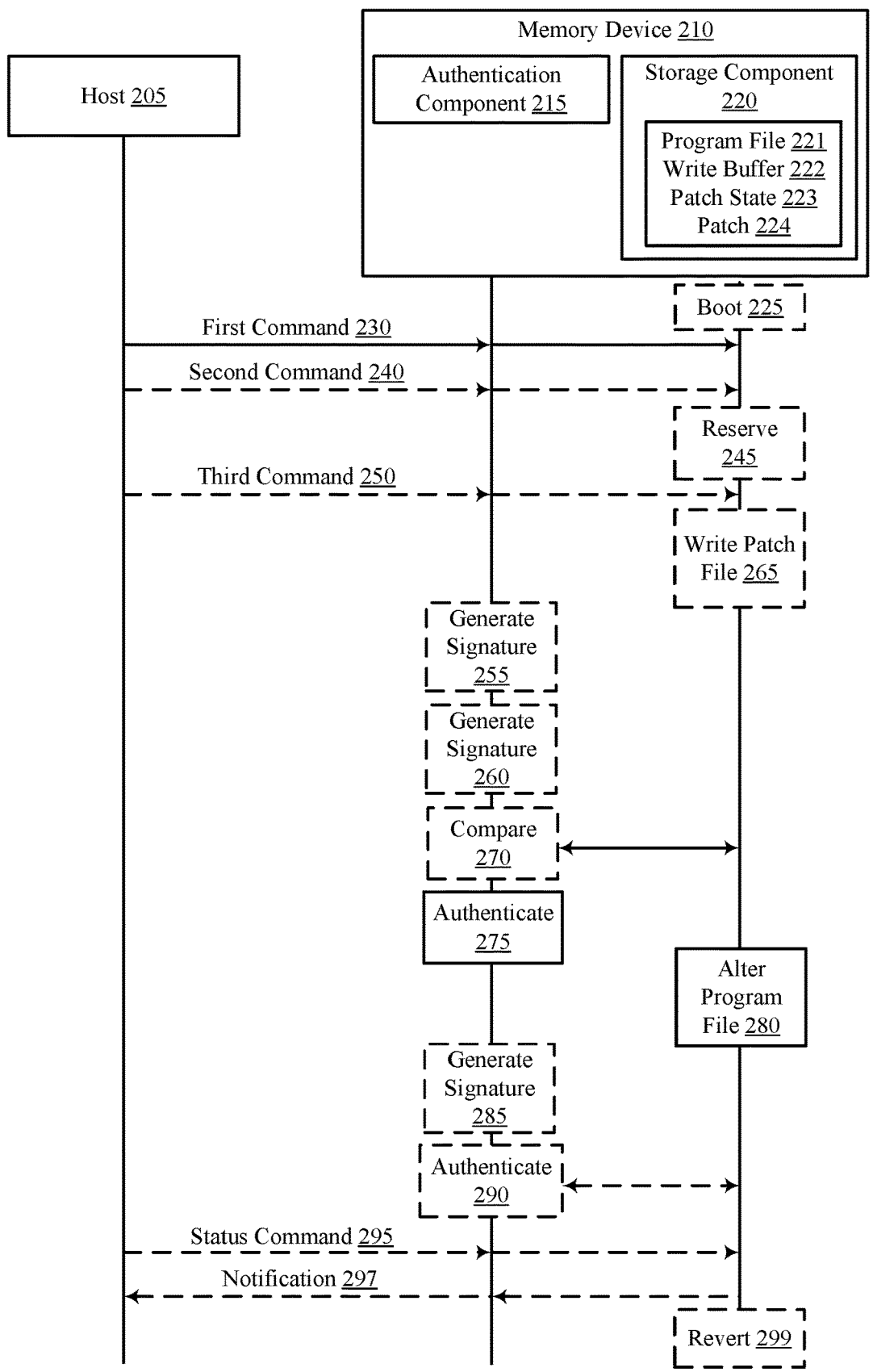
FIG. 2 illustrates an example of a process flow diagram that supports a differential write operation in accordance with examples as disclosed herein.

FIG. 2 illustrates an example of a process flow 200 that supports a differential write operation in accordance with examples as disclosed herein. The process flow 200 may illustrate one or more operations performed by a host device 205 and a memory device 210. In some examples, the memory device 210 may include an authentication component 215 and a storage component 220. The storage component 220 may include a program file 221, a write buffer 222, such as a write block buffer (WBB), a patch state 223, and a patch 224. Additionally or alternatively, the memory device 210 may include one or more blocks of memory cells, such as nonvolatile memory cells. In some examples, the one or more blocks of memory cells may be included as part of the storage component 220. As illustrated in FIG. 2, operations occurring at the memory device 210 may be performed at or by a particular component (e.g., by authentication component 215 and/or storage component 220). However, as discussed herein, the operations performed at or by the memory device 210 may be performed by any combination of components. Further, the ordering of the operations shown by FIG. 2 is exemplary and the operations may be performed in a different order than shown.

The operations shown in FIG. 2 may result in one or more files stored at the memory device 210 being updated using a patch file. For example, the memory device 210 may contain a program file (e.g., an image file, a binary file, etc.). The file may originally exist in a first state (e.g., F) and the update may result in the file being updated to a second state (e.g., a different state, F') using a patch file (e.g., F_diff). The patch file may be provided to the memory device 210 by the host device 205 and may consist of a difference between the first state and the second state (e.g., a difference between F and F'). In some examples, the patch file may include or be associated with a signature (e.g., F_diff_signature) for authenticating that the patch file is valid and/or received from an authenticated source. For example, the authentication component 215 may compare the patch file signature with a signature that is unique to the memory device 210. Based on the patch file being authenticated, at least a portion of the update may be performed at or by the storage component 220 to prevent adverse effects to the file due to a system error or unexpected event (e.g., due to power loss of the memory device 210).

In some examples a boot event 225 may occur, which may trigger one or more operations for updating a file at the memory device 210. For example, the occurrence of the boot event 225 may result in the program file being updated from a first state to a second state (e.g., at 280). In other examples, the boot event 225 may occur during any portion of the operation shown in FIG. 2. For example, the patch file (e.g., F_diff) may be authenticated (e.g., at 275) and a boot event 225 may occur at a time after the patch file is authenticated. In such an example, the occurrence of the boot event 225 may result in the program file being updated to a second state (e.g., to F'). A boot event 225 may include the memory device 210 being powered-on, reset, or the like and may result in an algorithm being applied to the program file and/or update in order to alter the program file from a first state (e.g., from F) to a second state (e.g., to F'). In other examples, the boot event 225 may result in the program file being reverted (e.g., at 299) from any state to the first state (e.g., to F).

To alter a program file from a first state to a second state, the host device 205 may transmit a first command 230 to the memory device 210. The first command 230 may be configured to cause the program file (e.g., the program file stored at the memory device 210) to be altered from the first state to the second state. For example, the first command 230 may activate an algorithm (e.g., an algorithm stored at the memory device 210) to modify a target storage area (e.g., the program file). In some examples, activating the algorithm may modify the program file (e.g., F) to a second state (e.g., F'). In some examples, the first command 230 may be transmitted to the authentication component 215 and/or the storage component 220 and may initiate the alteration of the program file from the first state to the second state (e.g., at 280). The first command 230 may include the patch file (e.g., F_diff) or may instruct the memory device 210 to apply the patch file to the program file (e.g., in the event that the patch file is already stored by the storage component 220). In addition to including the patch file or instructing the memory device 210 to apply the patch file, the first command 230 may include a signature associated with the patch file (e.g., F_diff_signature) and/or a signature associated with the second state of the program file (e.g., F'_signature). Each of the signatures may be used by the authentication component 215 to ensure that the patch file is secure and/or that the program file was properly altered to the second state. In some examples, after the memory device 210 receives the first command 230, the patch file (e.g., F_diff) may be authenticated using the signature of the patch file (e.g., F_diff_signature) and a signature at the memory device 210 (e.g., a second signature).

In some examples, the host device 205 may transmit a second command 240 to the memory device 210. The second command 240 may be configured to allocate a portion of the storage component 220 for the patch file and the signature associated with the patch file. For example, the second command 240 may restrict a portion of the storage component 220 for storing the patch file (e.g., F_diff), a signature associated with the patch file (e.g., F_diff_signature), and/or a signature associated with the updated program file (e.g., F'_signature). In some examples, the second command 240 may specify an algorithm to be used for updating the program file to the second state. In some examples, the second command 240 may be transmitted to the authentication component 215 and/or the storage component 220 and may initiate the memory device 210 reserving a portion of the storage component 220 for at least the patch file (e.g., F_diff). In other examples, the second command 240 may initiate the memory device 210 reserving a portion of the storage component 220 for the signature associated with the patch file (e.g., F_diff_signature) and/or a signature associated with the second state of the program file (e.g., F'_signature).

At 245, upon receiving the second command 240, the memory device 210 may reserve a portion of the storage component 220 for storing any files (e.g., any data) related to the update (e.g., F_diff, F_diff_signature, F'_signature). In some examples, the memory device 210 may reserve a portion of the storage component 220 for storing one or more algorithms. For example, a portion of the storage component 220 may be reserved for storing data (e.g., internal data) related to the state of an algorithm used to alter the program file (e.g., at 280) and/or an algorithm used to revert the program file (e.g., at 299). The particular portion of the storage component 220 reserved may be determined by the memory device 210 (e.g., by a memory controller associated with the memory device 210) or may be indicated by the second command 240. For example, the second command 240 may indicate one or more addresses (e.g., a row address, a column address) to be reserved for the associated files. In some examples, the second state of the program file may use additional storage at the memory device 210. That is, the second state of the program file may occupy more storage than the first state of the program file. Accordingly, in addition to reserving a portion of the storage component 220 for storing any files related to the update, the second command 240 may specify (e.g., reserve) additional space within the storage component 220. The additional space reserved may be determined by the memory device 210 or may be indicated by the second command 240, and may be reserved for the updated second state of the program file (e.g., for F').

In some examples, the host device 205 may transmit a third command 250 to the memory device 210. The third command 250 may be configured to write the patch file to the allocated portion of the storage component 220 (e.g., as specified by the second command 240). For example, the third command 250 may write (e.g., securely write) the patch file (e.g., F_diff), a signature associated with the patch file (e.g., F_diff_signature), and/or a signature associated with the updated program file (e.g., F'_signature) to the allocated area of the storage component 220. In some examples, the third command 250 may be transmitted based on or after the second command 250 is transmitted. In some examples, the third command 250 may be transmitted to the authentication component 215 and/or the storage component 220 and may write at least the patch file to the storage component 220 (e.g., at 265). In other examples, the third command 250 may write the signature associated with the patch file (e.g., F_diff_signature) and/or a signature associated with the second state of the program file (e.g., F'_signature) to the storage component 220. In some examples, the first command 230 and the third command 250 may be a same command or may be two independent commands as shown in FIG. 2. For example, the first command 230 may initiate an update operation and the third command 250 may write the requisite files to the storage component 220. Alternatively, the first command 230 may both initiate the update operation and write the requisite files to the storage component 220. In the case of a single command, the command may be issued after a portion of the storage component 220 is reserved for the files.

To authenticate the patch file written to the storage component 220 (e.g., at 265), the authentication component 215 may generate one or more signatures for authenticating the patch file, the updated program file, or both. For example, at 255, the authentication component 215 may generate a signature (e.g., a second signature) that is used to authenticate the patch file. The signature may be generated using an algorithm (e.g., a cryptographic algorithm) and may be generated on the fly (e.g., each time a patch file is written to the storage component 220) or may be generated and stored to the memory device 210 (e.g., for use in subsequent authentication processes). The signature may be unique to the memory device 210 and may facilitate the authentication of the patch file, which may prevent the memory device 210 from receiving patch files from untrusted sources or from receiving untrusted and/or unsafe patch files. After generating the signature (e.g., at 255), the authentication component 215 may compare the generated signature with the signature associated with the patch file (e.g., with F_diff_signature) at 270. If the signatures match, the patch file may be authenticated (e.g., at 275) and the program file may be altered (e.g., at 280). However, if the signatures do not match, the patch file may not be authenticated (e.g., at 275) and the program file may not be altered (i.e., it may remain in its current state). In either instance (e.g., if the program file is updated or not updated), the contents of the storage component 220 that are associated with the update operation may be deleted.

In some examples, the first command 230 and/or the third command 250 may be associated with a command signature. The authentication component 215 may be configured to authenticate the command signature as an added layer of security to ensure that the command and/or the source of the command is trusted. In order to authenticate the command signature, the authentication component 215 may generate one or more signatures for authenticating the first command 230, the third command 250, or both. For example, at 260, the authentication component 215 may generate a signature (e.g., a fourth signature) for authenticating the command(s). The signature may be generated using an algorithm (e.g., a cryptographic algorithm) and may be generated on the fly (e.g., each time a command is received by the memory device 210) or may be generated and stored to the memory device 210 (e.g., for use in subsequent authentication processes). The signature may be unique to the memory device 210 and may facilitate the authentication of the command(s), which may prevent the memory device 210 from receiving patch files from untrusted sources or from receiving untrusted and/or unsafe patch files. After generating the signature (e.g., at 260), the authentication component 215 may compare the generated signature with the signature associated with the command(s) at 270. If the signatures match, the patch file may be authenticated (e.g., at 275) and the program file may be altered (e.g., at 280). However, if the signatures do not match, the patch file may not be authenticated (e.g., at 275) and the program file may not be altered (i.e., it may remain in its current state). In either instance (e.g., if the program file is updated or not updated), the contents of the storage component 220 that are associated with the update operation may be deleted.

In some examples, altering the program file (e.g., at 280) may be initialized upon receiving the first command 230 or the third command 250. Such initialization may involve setting the content of the patch state 223. After initialization, the alteration process may begin (e.g., be launched) based on a triggering event, which may include a boot event 225 or reception of a first command 230. The alteration process may include reading the patch file 224 and identifying a portion (e.g., a first portion) of the program file 221 to be modified from a first state to a second state. The first portion of the program file 221 in first state may be moved (e.g., copied) into the write buffer 222, and the patch state 223 may be altered (e.g., changed) to indicate that the first portion of the program file 221 is being written. In some examples, the alteration process (e.g., at 280) may utilize the patch file 224 and the write buffer 222 to produce the first portion of the program file 221 in a second state. The second state of the program file 221 may replace the first portion of the program file 221. The patch state 223 may then be changed to indicate that writing the first portion of the program file 221 is complete. The alteration process (e.g., at 280) may proceed to read the patch file 224 and identify a second portion of the program file 221 to be modified. In some examples, content stored to the write buffer 222 may be replaced with the second portion of the program file 221 in first state and follow the same sequence described herein to change the second portion of the program file 221 to a second state. The program file alteration process may be completed when the patch file has been applied in its entirety.

In some examples, altering a program file (e.g., at 280) may be interrupted by a power loss or other event. In such cases, the program file alteration process may be resumed after the interrupting event has ended. In such cases, the program file alteration process may read the patch state 223, and in some cases, may then read the current content of the write buffer 222 and the patch file 224 to change the current portion of the program file 221 from first to second state. After such operations, the alteration may continue the sequence described herein. In other cases, the program file alteration process may include reading the next portion of the program file 221 to be altered and continue the sequence described herein.

In some examples, altering the program file (e.g., at 280) may be interrupted by a power loss or other event. In such cases, altering the program file may be cancelled, and a revert process (e.g., at 299) may be initiated. In such cases, the reversion process may read the patch state 223, obtain the index of the last write operation and, in some cases, may replace the portion of the program file 221 at the index position with the current content of the write buffer 222. In some examples, the reversion process may read the patch file 224 and determine the portion of the program file 221 in second state at a position one step before the index. This portion of the program file in second state may be copied in the write buffer 222, and the patch state 223 may be changed to indicate the portion at one position before the index. The reversion process may read the patch file 224 and the write buffer 222 to produce the portion of the program file in first state at one position before index.

In some examples, the patch state 223 may be then changed to indicate a portion at one position before the index reverted. The reversion process may proceed to read the patch file 224 and identify another portion of the program file 221 to be reverted, replace the write buffer 222 with the next portion of the program file 221 in second state, and follow the sequence described herein to change (e.g., alter) the next portion of the program file to its first state. The reversion process (e.g., at 299) may be completed when the patch file has been reverted in its entirety and the program file 221 exists in a first state.

In some examples, program file alteration process (e.g., at 299) may be interrupted by a power loss or other event. In such cases, the reversion process may be resumed after the interrupting event has ended. In such cases, the reversion process may include reading the patch state 223, and in some cases, may include reading the current content of the write buffer 222 and the patch file 224 to change the current portion of the program file 221 from second to first state and then continue the sequence described herein. In some cases, the reversion process may include reading the next portion of the program file 221 to be reverted and continue the sequence described herein.

In some examples, the authentication component 215 may verify (e.g., authenticate) the updated state of the program file. As discussed herein, the first command 230 and/or the third command 250 may include a signature associated with the second state of the program file (e.g., F'_signature). The authentication component 215 may be configured to authenticate the signature to ensure that the program file was properly updated. In order to signature, the authentication component 215 may generate one or more signatures for authenticating the updated state of the program file. For example, at 285, the authentication component 215 may generate a signature (e.g., a third signature). The signature may be generated using an algorithm (e.g., a cryptographic algorithm) and may be generated on the fly (e.g., each time a patch file is received by the memory device 210) or may be generated and stored to the memory device 210 (e.g., for use in subsequent authentication processes). The signature may be unique to the memory device 210 and may facilitate the authentication of the updated program file, which may prevent the memory device 210 from running an improperly-updated program file. After generating the signature (e.g., at 285), the authentication component 215 may authenticate the updated program file (e.g., at 290). However, if the signatures do not match, the program file may be reverted to a prior state (e.g., at 299).

During an update process as described herein, the host device 205 may inquire about the current status of the update. For example, the host device 205 may inquire whether the update has commenced, is ongoing, was completed, and/or whether an error occurred. The host device 205 may inquire whether a specific step or sub-step of a process is complete. To inquire into the status of the update, the host device 205 may transmit a status command 295 to the memory device 210. Because the host device 205 may inquire into the status of various steps in the update process, the status command 295 may be transmitted to the memory device 210 before or after any operation depicted in FIG. 2.

In some examples, a status command 295 may be transmitted at various (e.g., multiple times) during the operations described herein. For example, the host 205 may transmit a first command 230 to the memory device 210. After transmitting the first command 230, the host 205 may transmit a status command 295 to inquire whether the update has commenced, is ongoing, was completed, and/or whether an error occurred. The host 205 may receive an acknowledgement that the update has commenced, is ongoing, or was completed, or a negative acknowledgement that the update has not commenced, is not ongoing, was not completed, or than an error occurred.

Additionally or alternatively, a status command 295 may be transmitted after the second command 240 has been transmitted (e.g., by the host 205). In some examples, the host 205 may transmit a status command 295 to inquire whether a portion of the package area has been reserved to store the patch file (e.g., F_diff), a signature associated with the patch file (e.g., F_diff_signature), and/or a signature associated with the updated program file (e.g., F'_signature). The host 205 may receive an acknowledgement that the portion of the storage component 220 has been reserved, or a negative acknowledgement that the portion of the storage component 220 has not been reserved or than an error occurred in reserving the portion.

In other examples, a status command 295 may be transmitted after the third command 250 has been transmitted (e.g., by the host 205). In some examples, the host 205 may transmit a status command 295 to inquire whether the patch file (e.g., F_diff), a signature associated with the patch file (e.g., F_diff_signature), and/or a signature associated with the updated program file (e.g., F'_signature) were written to the reserved portion of the storage component 220. The host 205 may receive an acknowledgement that the patch file (e.g., F_diff), the signature associated with the patch file (e.g., F_diff_signature), and/or the signature associated with the updated program file (e.g., F'_signature) were written to the reserved portion, or a negative acknowledgement that the patch file (e.g., F_diff), the signature associated with the patch file (e.g., F_diff_signature), and/or the signature associated with the updated program file (e.g., F'_signature) were not written to the reserved portion, or that an error occurred when writing the files.

In some examples, the status command 295 may inquire as to whether the program file was successfully altered from the first state to the second state (e.g., at 280). If successfully altered, the memory device 210 may transmit a notification 297 to the host device 205 acknowledging the successful update of the program file. In some examples, a notification including an acknowledgement be referred to as an ACK (e.g., the memory device 210 may transmit an ACK). However, if the program file was not successfully altered from the first state to the second state, the memory device 210 may transmit a notification 297 to the host device 205 acknowledging the unsuccessful update of the program file. In some examples, a notification including an unsuccessful acknowledgement may be referred to as a negative acknowledgement or a NACK (e.g., the memory device 210 may transmit a NACK). In the event of a NACK, the memory device 210 may revert the program file to a prior state (e.g., at 299).

The memory device may transmit a NACK to the host device 205 due to a variety of events (e.g., errors) occurring. For example, the patch file may have been successfully written to the storage component 220, the signature associated with the patch file may not have matched the signature generated by the memory device 210 (e.g., at 255), the signature associated with the first command 230 and/or the third command 250 may not have matched the signature generated by the memory device 210 (e.g., at 265), and/or the signature associated with the updated version of the program file may not have matched the signature generated by the memory device 210 (e.g., at 285). In any such events, the memory device 210 may transmit a notification 297 to the host device 205 indicating the error, and may revert the program file to a prior state (e.g., at 299).

The memory device 210 may be configured to revert the program file to a prior state in the event that the program file was unsuccessfully altered from a first state to a second state. As discussed herein, the program file may be unsuccessfully altered due to a variety of events including but not limited to power loss, data corruption, and/or one or more signatures not being authenticated. In other examples, the memory device 210 may determine one or more characteristics of the host device 205, such as an Internet Protocol (IP) address of the host device 205. Based on whether the characteristic is deemed trustworthy by the memory device 210, the program file may be altered or unaltered. In any such event, it may be advantageous to refrain from running the program file in its current state to avoid further errors. Accordingly, when the memory device 210 determines that the program file was unsuccessfully altered, the memory device 210 may revert the program file to its prior state (e.g., to F). In other examples, the memory device 210 may revert the program file to a state prior to F (e.g., to a state prior to the program file being updated to F). Such prior states may be stored (e.g., archived) to the storage component 220 or another storage component of the memory device 210. After reverting the program file to a prior state, the contents of the storage component 220 that are associated with the update operation may be deleted.

As described above, the host device 205 and memory device 210 may be configured to alter a program file (e.g., F) from a first state to a second state (e.g., F') using a patch file (e.g., F_diff). To generate F_diff, the host device 205 may run an algorithm on both F and F'. However, in the event that the program file is reverted to a prior state (e.g., at 299), the host device 205 may apply the algorithm to F and F_diff in order to generate F'. In other examples, the host device 205 may apply the algorithm to F' and F_diff to generate F. Accordingly, the algorithm used by the host device 205 may be reversible, which may allow for the host device 205 to generate various states of the program file and/or altered program file. Utilizing a reversible algorithm may ensure that the program file at the memory device 210 may be updated (e.g., altered) and/or reverted to a prior state in the case of an error.

Figure 3:
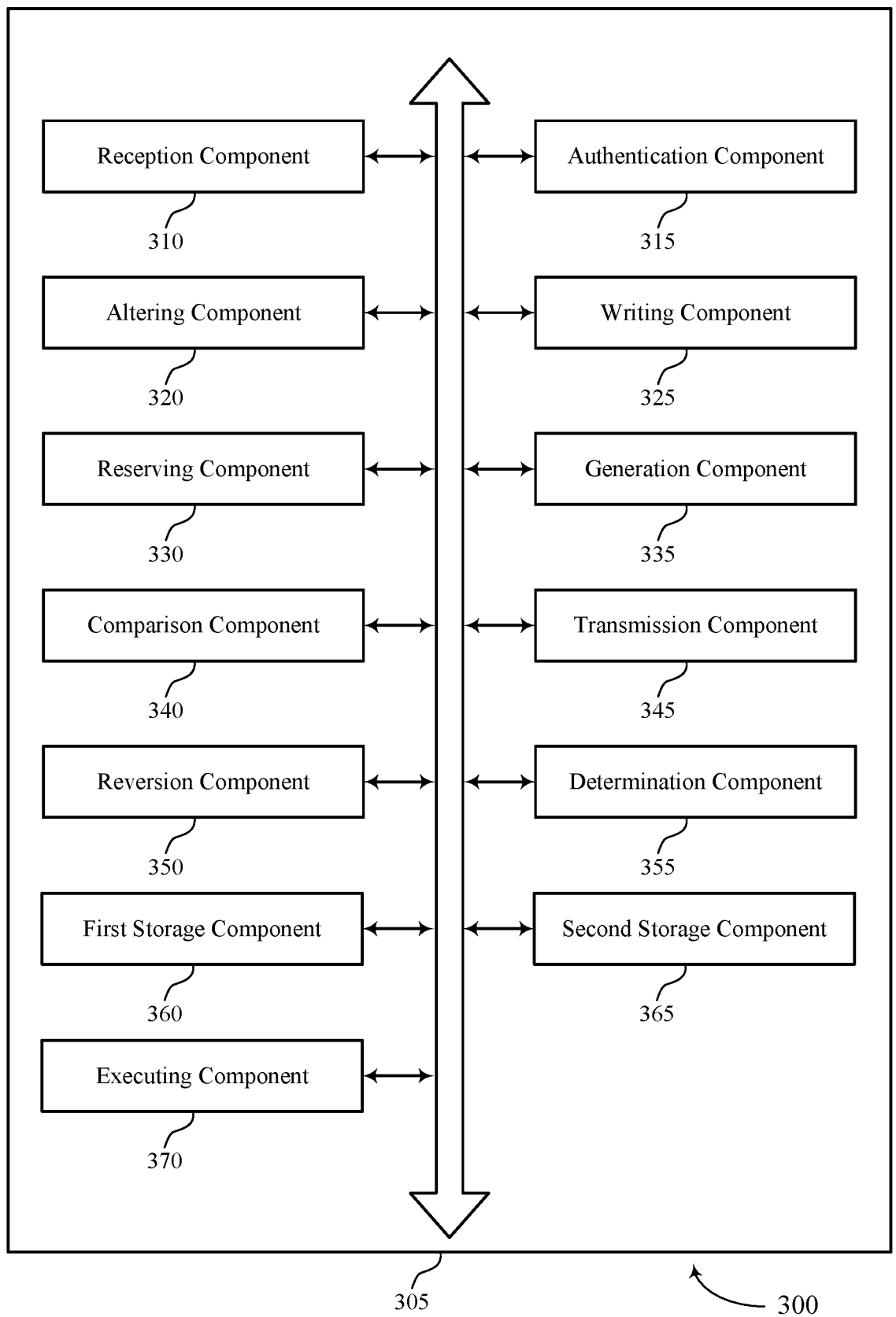
FIG. 3 shows a block diagram of a memory device that supports a differential write operation in accordance with examples as disclosed herein.

FIG. 3 shows a block diagram 300 of a memory device 305 that supports a differential write operation in accordance with examples as disclosed herein. The memory device 305 may be an example of aspects of a memory device as described with reference to FIGS. 1 and 2. The memory device 305 may include a reception component 310, an authentication component 315, an altering component 320, a writing component 325, a reserving component 330, a generation component 335, a comparison component 340, a transmission component 345, a reversion component 350, a determination component 355, a first storage component 360, a second storage component 365, and an executing component 370. Each of these modules may communicate, directly or indirectly, with one another (e.g., via one or more buses).

The reception component 310 may receive, at a memory device, a command for altering a portion of a program file from a first state to a second state using a patch file and a first signature associated with the patch file, the patch file including a difference between the first state and the second state of the portion of the program file. In some examples, the reception component 310 may receive, at the memory device, a second command indicating memory of the buffer to allocate for the patch file and the first signature, where writing the patch file and the first signature to the buffer is based on receiving the second command.

In some examples, the reception component 310 may receive a third command for writing the patch file and the first signature to the buffer after receiving the second command, where writing the patch file and the first signature to the buffer is based on receiving the third command. In some examples, the reception component 310 may receive a third signature associated with the second state of the program file. In some examples, the reception component 310 may receive, at the memory device, a status command including a request for an indication of a status of one or more alterations of the program file using the patch file.

The authentication component 315 may authenticate the patch file using the first signature and using a second signature that is associated with the patch file and is generated by the memory device based on receiving the command. In some examples, the authentication component 315 may authenticate the program file using the third signature after altering the program file from the first state to the second state using the patch file. The altering component 320 may alter the portion of the program file from the first state to the second state using the patch file based on authenticating the patch file.

The writing component 325 may write the patch file and the first signature to a buffer of the memory device, where authenticating the patch file is based on writing the patch file and the first signature to the buffer. In some examples, the writing component 325 may write a portion of the program file to a buffer of the memory device based on receiving the command, where altering the portion of the program file from the first state to the second state is based on writing the portion of the program file to the buffer.

The reserving component 330 may reserve a portion of the buffer for writing the patch file based on receiving the second command, where writing the patch file and the first signature to the buffer is based on the reserving.

The generation component 335 may generate, at the memory device, the second signature using the patch file and a cryptographic key stored by the memory device. In some examples, the generation component 335 may generate, at the memory device, a fourth signature.

The comparison component 340 may compare the first signature with the second signature, where authenticating the patch file is based on the comparison.

The transmission component 345 may transmit, to a host device, a notification including a status of the one or more alterations of the program file based on receiving the status command.

The reversion component 350 may revert the program file to the first state based on the notification including an indication that the program file was not altered from the first state to the second state.

The determination component 355 may determine that the fourth signature matches a signature associated with the command, where the patch file is written to a buffer of the memory device based on the determination. In some examples, the determination component 355 may determine an occurrence of a boot event associated with the memory device, where altering the program file from the first state to the second state is based on determining the occurrence of the boot event.

The first storage component 360 may be an example of the storage component 220 as described with reference to FIG. 2 or may be an example of a different storage component. In some examples, the first storage component 360 may store a program file, a portion of a program file to be updated (e.g., altered) from a first state to a second state, and/or a patch file (e.g., F_diff). In other examples, the first storage component 360 may store a signature associated with the patch file (e.g., F_diff_signature) and/or a signature associated with the updated state of the program file (e.g., F'_signature). The first storage component 360 may be configured to communicate with the other components of the memory device 305 in order to alter a state of a program file.

The second storage component 365 may be an example of the storage component 220 as described with reference to FIG. 2 or may be an example of a different storage component. Additionally or alternatively, the second storage component 365 may be a same or a different storage component than the first storage component 360. In some examples, the second storage component 365 may store a program file, a portion of a program file to be updated (e.g., altered) from a first state to a second state, and/or a patch file (e.g., F_diff). In other examples, the second storage component 365 may store a signature associated with the patch file (e.g., F_diff_signature) and/or a signature associated with the updated state of the program file (e.g., F'_signature). The second storage component 365 may be configured to communicate with the other components of the memory device 305 in order to alter a state of a program file.

The executing component 370 may apply a patch file to a program file in order to alter the program file from a first state to a second state. In some examples, the executing component may be configured to communicate with the other components of the memory device 305 in order to alter a state of a program file.

Figure 4:
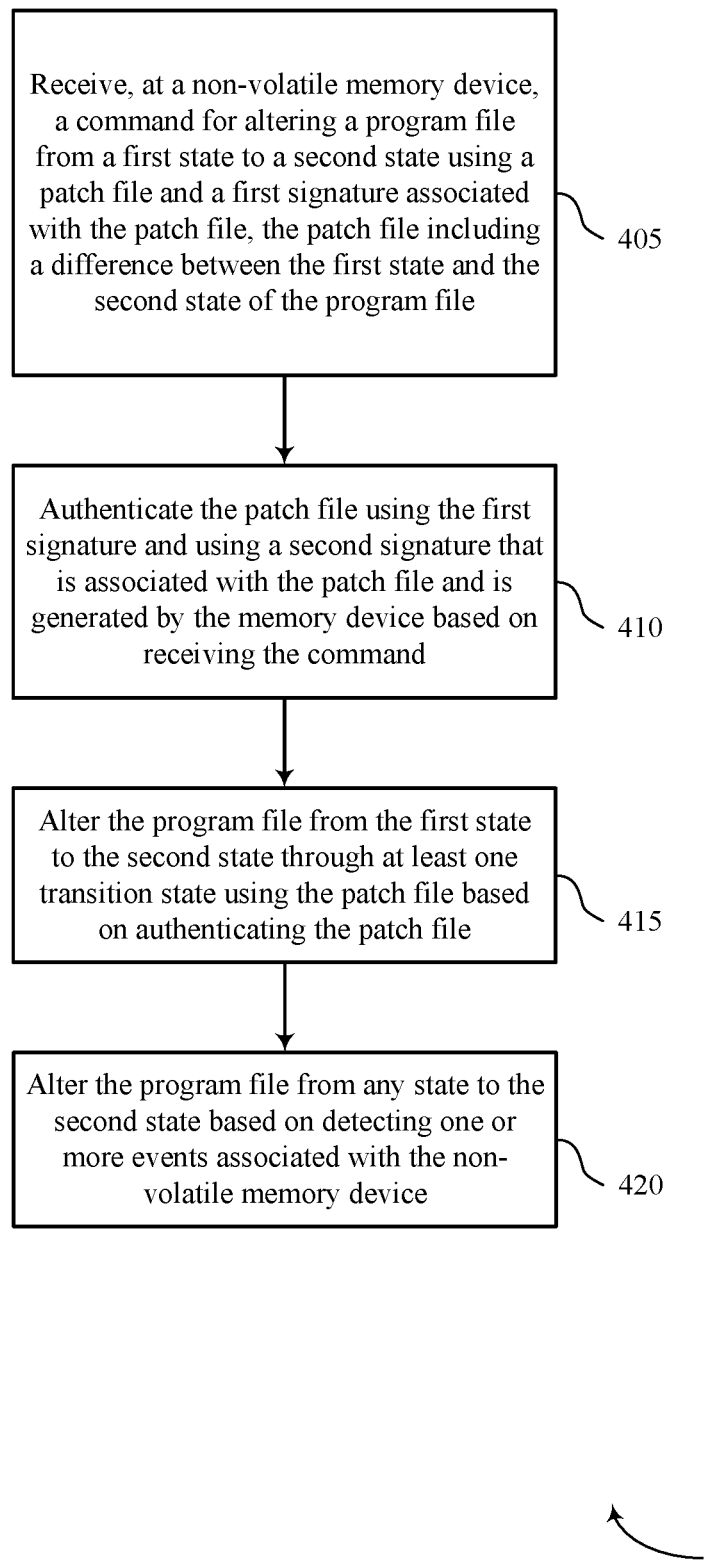
FIGS. 4 through 6 show flowcharts illustrating a method or methods that support a differential write operation in accordance with examples as disclosed herein.

FIG. 4 shows a flowchart illustrating a method or methods 400 that supports a differential write operation in accordance with examples as disclosed herein. The operations of method 400 may be implemented by a memory device or its components as described herein. For example, the operations of method 400 may be performed by a memory device as described with reference to FIG. 3. In some examples, a memory device may execute a set of instructions to control the functional elements of the memory device to perform the described functions. Additionally or alternatively, a memory device may perform aspects of the described functions using special-purpose hardware.

At 405, a non-volatile memory device may receive a command for altering a program file from a first state to a second state using a patch file and a first signature associated with the patch file, the patch file including a difference between the first state and the second state of the portion of the program file. The operations of 405 may be performed according to the methods described herein. In some examples, aspects of the operations of 405 may be performed by a reception component as described with reference to FIG. 3.

At 410, the memory device may authenticate the patch file using the first signature and using a second signature that is associated with the patch file and is generated by the memory device based on receiving the command. The operations of 410 may be performed according to the methods described herein. In some examples, aspects of the operations of 410 may be performed by an authentication component as described with reference to FIG. 3.

At 415, the memory device may alter the program file from the first state to the second state through at least one transition state using the patch file based on authenticating the patch file. The operations of 415 may be performed according to the methods described herein. In some examples, aspects of the operations of 415 may be performed by an altering component as described with reference to FIG. 3.

At 420, the memory device may alter the program file from any state to the second state based on detecting one or more events associated with the non-volatile memory device. The operations of 415 may be performed according to the methods described herein. In some examples, aspects of the operations of 415 may be performed by an altering component as described with reference to FIG. 3.

In some examples, an apparatus as described herein may perform a method or methods, such as the method 400. The apparatus may include features, means, or instructions (e.g., a non-transitory computer-readable medium storing instructions executable by a processor) for receiving, at a memory device, a command for altering a program file from a first state to a second state using a patch file and a first signature associated with the patch file, the patch file including a difference between the first state and the second state of the program file, authenticating the patch file using the first signature and using a second signature that is associated with the patch file and is generated by the memory device based on receiving the command, and altering the program file from the first state to the second state using the patch file based on authenticating the patch file.

Some examples of the method 400 and the apparatus described herein may further include operations, features, means, or instructions for writing the patch file and the first signature to a buffer of the memory device, where authenticating the patch file may be based on writing the patch file and the first signature to the buffer.

Some examples of the method 400 and the apparatus described herein may further include operations, features, means, or instructions for receiving, at the memory device, a second command indicating memory of the buffer to allocate for the patch file and the first signature, where writing the patch file and the first signature to the buffer may be based on receiving the second command.

Some examples of the method 400 and the apparatus described herein may further include operations, features, means, or instructions for reserving a portion of the buffer for writing the patch file based on receiving the second command, where writing the patch file and the first signature to the buffer may be based on the reserving.

Some examples of the method 400 and the apparatus described herein may further include operations, features, means, or instructions for receiving a third command for writing the patch file and the first signature to the buffer after receiving the second command, where writing the patch file and the first signature to the buffer may be based on receiving the third command.

Some examples of the method 400 and the apparatus described herein may further include operations, features, means, or instructions for generating, at the memory device, the second signature using the patch file and a cryptographic key stored by the memory device, and comparing the first signature with the second signature, where authenticating the patch file may be based on the comparison.

Some examples of the method 400 and the apparatus described herein may further include operations, features, means, or instructions for receiving a third signature associated with the second state of the program file, and authenticating the program file using the third signature after altering the program file from the first state to the second state using the patch file.

Some examples of the method 400 and the apparatus described herein may further include operations, features, means, or instructions for writing the program file to a buffer of the memory device based on receiving the command, where altering the program file from the first state to the second state may be based on writing the program file to the buffer.

Some examples of the method 400 and the apparatus described herein may further include operations, features, means, or instructions for receiving, at the memory device, a status command including a request for an indication of a status of one or more alterations of the program file using the patch file, and transmitting, to a host device, a notification including a status of the one or more alterations of the program file based on receiving the status command.

In some examples of the method 400 and the apparatus described herein, the notification includes an acknowledgement that the program file was altered from the first state to the second state based on the altering. Some examples of the method 400 and the apparatus described herein may further include operations, features, means, or instructions for reverting the program file to the first state based on the notification including an indication that the program file was not altered from the first state to the second state.

In some examples of the method 400 and the apparatus described herein, altering the program file from the first state to the second state may include operations, features, means, or instructions for updating the program file to a new state or reverting the program file to a prior state. Some examples of the method 400 and the apparatus described herein may further include operations, features, means, or instructions for generating, at the memory device, a fourth signature, and determining that the fourth signature matches a signature associated with the command, where the patch file may be written to a buffer of the memory device based on the determination.

Some examples of the method 400 and the apparatus described herein may further include operations, features, means, or instructions for determining an occurrence of a boot event associated with the memory device, where altering the program file from the first state to the second state may be based on determining the occurrence of the boot event. In some examples of the method 400 and the apparatus described herein, the memory device includes a set of nonvolatile memory cells.

Some examples of the method 400 and the apparatus described herein may further include operations, features, means, or instructions for detecting a power loss event associated with the non-volatile memory device, where detecting the power loss event indicates an additional alteration of the program file, and wherein altering the program file from any state to the second state is based at least in part on detecting the power loss event.

Some examples of the method 400 and the apparatus described herein may further include operations, features, means, or instructions for writing a first portion of the program file to a non-volatile buffer of the memory device, the first portion of the program file comprising a first state, writing at least a portion of a transition state of the first portion of the program file to the non-volatile buffer, and replacing the first portion of the program file in the first state with a second portion of the program file, where altering the program file from the first state to the second state is based at least in part on writing the first portion of the program file to the non-volatile buffer.

Some examples of the method 400 and the apparatus described herein may further include operations, features, means, or instructions for replacing the first portion of the program file in the first state with the second portion of the program file in a first state, writing at least a portion of a transition state of the second portion of the program file to the non-volatile buffer, and replacing the second portion of the program in the first state with a second portion of the program file in a second state, where altering the second portion of the program file from the first state to the second state is based at least in part on writing the second portion of the program file to the non-volatile buffer.

Some examples of the method 400 and the apparatus described herein may further include operations, features, means, or instructions for determining that an entirety of the patch file has been applied to alter the program file from the first state to the second state, receiving a third signature associated with the second state of the program file, authenticating the program file using the third signature, and issuing a notification based at least in part on the program file not being authenticated.

Some examples of the method 400 and the apparatus described herein may further include operations, features, means, or instructions for detecting an occurrence of an event at the non-volatile memory device, and resuming alteration of the program file from the first state to the second state using the newest transition state of the program file that is stored at the non-volatile buffer.

Some examples of the method 400 and the apparatus described herein may further include operations, features, means, or instructions for detecting an occurrence of a second event at the non-volatile memory device, and replacing the altered portion of the program with a portion of the program file in the first state stored in the non-volatile buffer.

Some examples of the method 400 and the apparatus described herein may further include operations, features, means, or instructions for replacing the portion of the program file in the first state with a first portion of the program file in a second state, writing information regarding the transition state of the first portion of the program file in the second state to the non-volatile buffer, and replacing the first portion of the program in the second state with the first portion of the program file in the first state, where altering the first portion of the program file from the second state to the first state is based at least in part on writing the first portion of the program file to the buffer.

Some examples of the method 400 and the apparatus described herein may further include operations, features, means, or instructions for determining that an entirety of the patch file has been applied to alter the program file from the second state to the first state, and issuing a notification based at least in part on determining that the entirety of the patch file has been applied.

Figure 5:
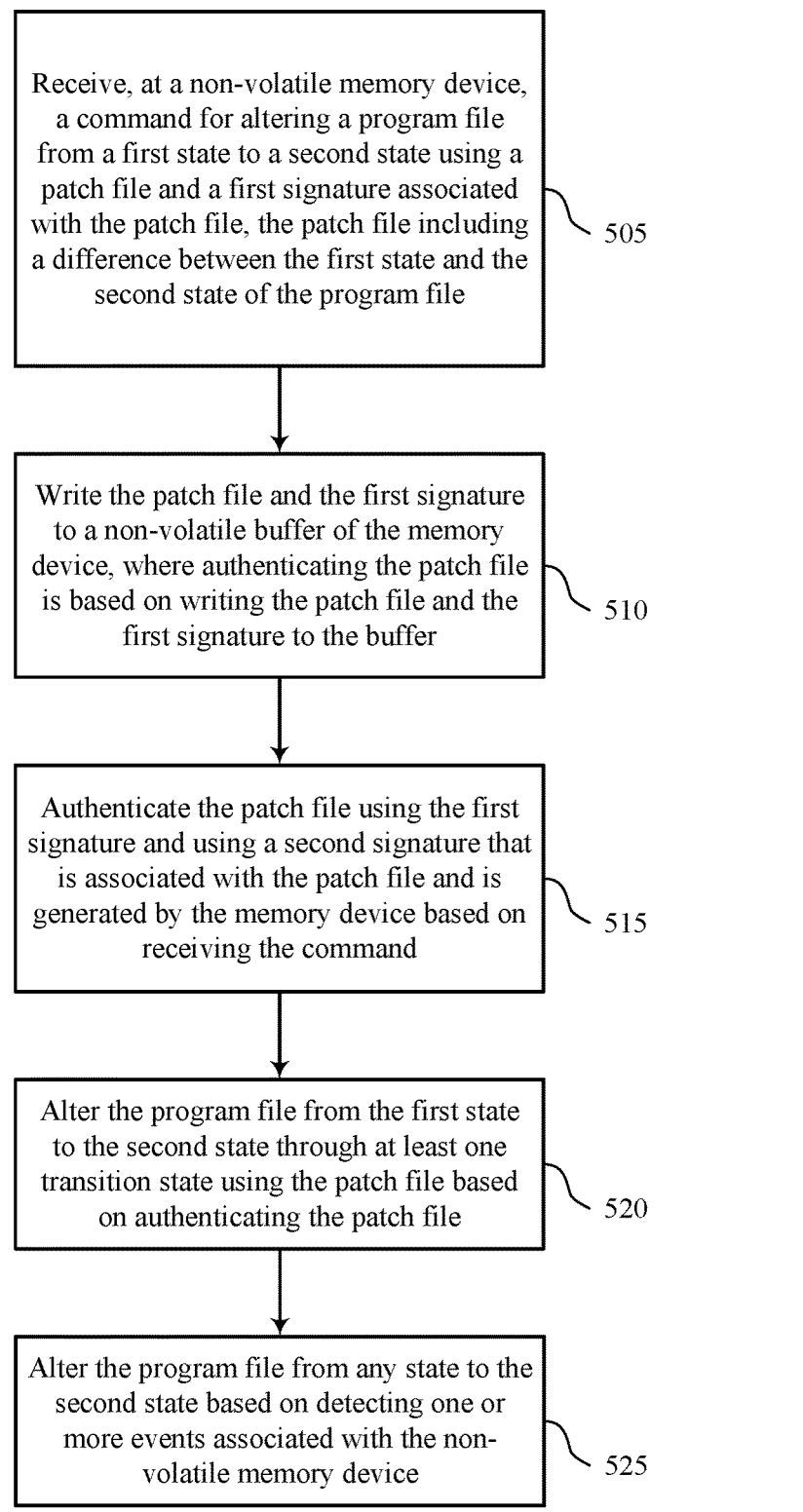

FIG. 5 shows a flowchart illustrating a method or methods 500 that supports a differential write operation in accordance with examples as disclosed herein. The operations of method 500 may be implemented by a memory device or its components as described herein. For example, the operations of method 500 may be performed by a memory device as described with reference to FIG. 3. In some examples, a memory device may execute a set of instructions to control the functional elements of the memory device to perform the described functions. Additionally or alternatively, a memory device may perform aspects of the described functions using special-purpose hardware.

At 505, a non-volatile memory device may receive a command for altering a program file from a first state to a second state using a patch file and a first signature associated with the patch file, the patch file including a difference between the first state and the second state of the program file. The operations of 505 may be performed according to the methods described herein. In some examples, aspects of the operations of 505 may be performed by a reception component as described with reference to FIG. 3.

At 510, the memory device may write the patch file and the first signature to a non-volatile buffer of the memory device, where authenticating the patch file is based on writing the patch file and the first signature to the buffer. The operations of 510 may be performed according to the methods described herein. In some examples, aspects of the operations of 510 may be performed by a writing component as described with reference to FIG. 3.

At 515, the memory device may authenticate the patch file using the first signature and using a second signature that is associated with the patch file and is generated by the memory device based on receiving the command. The operations of 515 may be performed according to the methods described herein. In some examples, aspects of the operations of 515 may be performed by an authentication component as described with reference to FIG. 3.

At 520, the memory device may alter the program file from the first state to the second state through at least one transition state using the patch file based on authenticating the patch file. The operations of 520 may be performed according to the methods described herein. In some examples, aspects of the operations of 520 may be performed by an altering component as described with reference to FIG. 3.

At 525, the memory device may alter the program file from any state to the second state based on detecting one or more events associated with the non-volatile memory device. The operations of 525 may be performed according to the methods described herein. In some examples, aspects of the operations of 525 may be performed by an altering component as described with reference to FIG. 3.

Figure 6:
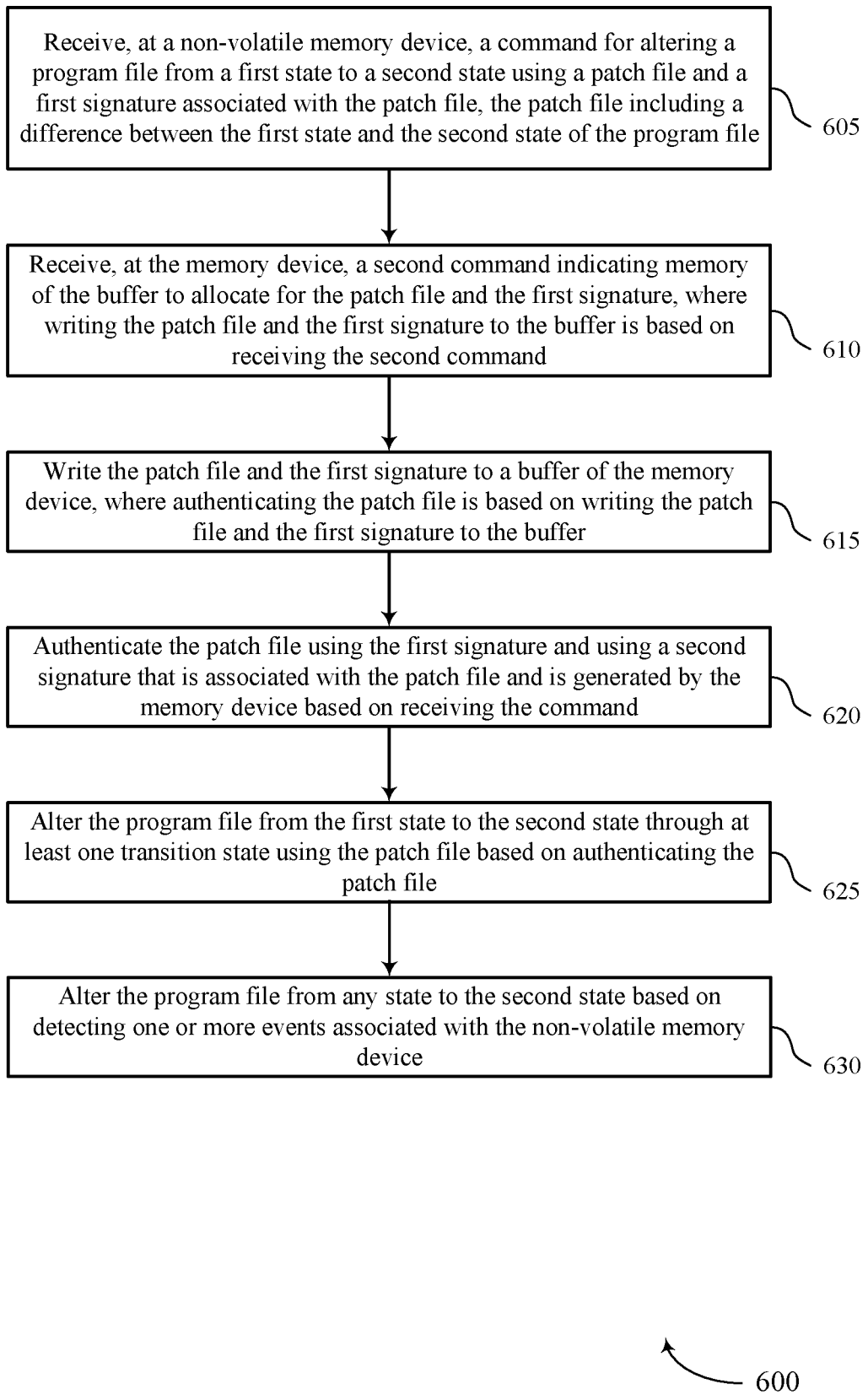

FIG. 6 shows a flowchart illustrating a method or methods 600 that supports a differential write operation in accordance with examples as disclosed herein. The operations of method 600 may be implemented by a memory device or its components as described herein. For example, the operations of method 600 may be performed by a memory device as described with reference to FIG. 3. In some examples, a memory device may execute a set of instructions to control the functional elements of the memory device to perform the described functions. Additionally or alternatively, a memory device may perform aspects of the described functions using special-purpose hardware.

At 605, a non-volatile memory device may receive a command for altering a program file from a first state to a second state using a patch file and a first signature associated with the patch file, the patch file including a difference between the first state and the second state of the program file. The operations of 605 may be performed according to the methods described herein. In some examples, aspects of the operations of 605 may be performed by a reception component as described with reference to FIG. 3.

At 610, the memory device may receive, at the memory device, a second command indicating memory of the buffer to allocate for the patch file and the first signature, where writing the patch file and the first signature to the buffer is based on receiving the second command. The operations of 610 may be performed according to the methods described herein. In some examples, aspects of the operations of 610 may be performed by a reception component as described with reference to FIG. 3.

At 615, the memory device may write the patch file and the first signature to a buffer of the memory device, where authenticating the patch file is based on writing the patch file and the first signature to the buffer. The operations of 615 may be performed according to the methods described herein. In some examples, aspects of the operations of 615 may be performed by a writing component as described with reference to FIG. 3.

At 620, the memory device may authenticate the patch file using the first signature and using a second signature that is associated with the patch file and is generated by the memory device based on receiving the command. The operations of 620 may be performed according to the methods described herein. In some examples, aspects of the operations of 620 may be performed by an authentication component as described with reference to FIG. 3.

At 625, the memory device may alter the program file from the first state to the second state through at least one transition state using the patch file based on authenticating the patch file. The operations of 625 may be performed according to the methods described herein. In some examples, aspects of the operations of 625 may be performed by an altering component as described with reference to FIG. 3.

At 630, the memory device may alter the program file from any state to the second state based on detecting one or more events associated with the non-volatile memory device. The operations of 630 may be performed according to the methods described herein. In some examples, aspects of the operations of 630 may be performed by an altering component as described with reference to FIG. 3.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a first storage component configured to store a program file, where at least a portion of the program file is configured to be altered from a first state to a second state using a patch file and a first signature associated with the patch file, a second storage component configured to store the portion of the program file and the patch file during an operation to alter the portion of the program file from the first state to the second state based on receiving a command, an authentication component configured to authenticate the patch file using the first signature and using a second signature, and an executing component configured to update the program file by altering the program file from the first state to the second state.

In some examples, the authentication component may be configured to generate the second signature. In some examples, the authentication component may be configured to determine that the first signature matches the second signature, and the program file may be altered from the first state to the second state based on the first signature matching the second signature. In some examples, the executing component may be configured to revert the program file to a prior state by altering the program file from the first state to the second state.

In some examples, a portion of the second storage component may be reservable for storing the patch file based on receiving the command. Some examples of the apparatus may include a transmission component configured to transmit a notification to a host device based on the program file being altered from the first state to the second state. In some examples, the first storage component and the second storage component may be a same storage component.

An apparatus is described. The apparatus may include a processor, memory coupled with the processor, and instructions stored in the memory and executable by the processor to cause the apparatus to receive a command for altering a portion of a program file from a first state to a second state using a patch file and a first signature associated with the patch file, authenticate the patch file using the first signature and using a second signature that is associated with the patch file and is generated by the processor based on receiving the command, and alter the portion of the program file from the first state to the second state using the patch file based on authenticating the patch file.

In some examples, the patch file may include operations, features, means, or instructions for receive a second command indicating memory of a buffer to allocate for the patch file and the first signature, reserve a portion of the buffer for writing the patch file based on receiving the second command, and write the patch file and the first signature to the reserved portion of the buffer. Some examples may further include receiving a status command including a request for an indication of a status of one or more alterations of the program file using the patch file, and transmit, to a host device, a notification including a status of the one or more alterations of the program file based on receiving the status command.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving, at a memory device, a command for altering a state of a program file using a patch file, the patch file comprising a differential characteristic of the program file;
   writing a first portion of the program file to a buffer of the memory device, the first portion of the program file;
   transitioning an initial state of the program file using the patch file based at least in part on writing the first portion of the program file to the buffer;
   writing at least a portion of a transition state of the first portion of the program file to the buffer; and
   altering the state of the program file based at least in part on detecting one or more events associated with the memory device.

2. The method of claim 1, further comprising:
   replacing the first portion of the program file with a second portion of the program file based at least in part on writing the first portion and the portion of the transition state to the buffer.

3. The method of claim 2, further comprising:
   replacing the first portion of the program file in the initial state of the program file with the second portion of the program file in the initial state;
   writing at least a portion of a transition state of the second portion of the program file to the buffer; and
   replacing the second portion of the program file in the initial state based at least in part on writing the second portion of the program file to the buffer.

4. The method of claim 3, further comprising:
   determining that an entirety of the patch file has been applied to alter the state of the program file;
   determining whether the program file is authenticated based at least in part on altering the state of the program file; and
   issuing a notification based at least in part on the program file not being authenticated.

5. The method of claim 4, further comprising:
   detecting an occurrence of an event at the memory device; and
   resuming alteration of the state of the program file using a second transition state of the program file stored at the buffer that is more recent than the transition state.

6. The method of claim 4, further comprising:
   detecting an occurrence of a second event at the memory device; and
   replacing the altered state of the program file with a portion of the program file in the initial state stored in the buffer based at least in part on detecting the occurrence of the second event at the memory device.

7. The method of claim 4, further comprising:

determining that the entirety of the patch file is applied to alter the state of the program file; and issuing a notification based at least in part on determining that the entirety of the patch file is applied.

8. The method of claim 1, further comprising:

writing the patch file to the buffer of the memory device.

9. The method of claim 8, further comprising:

receiving, at the memory device, a second command indicating memory of the buffer to allocate for the patch file, wherein writing the patch file to the buffer is based at least in part on receiving the second command.

10. The method of claim 9, further comprising:

reserving a portion of the buffer for writing the patch file based at least in part on receiving the second command, wherein writing the patch file to the buffer is based at least in part on reserving the portion of the buffer.

11. The method of claim 9, further comprising:

receiving a third command for writing the patch file to the buffer after receiving the second command, wherein writing the patch file to the buffer is based at least in part on receiving the third command.

12. The method of claim 1, wherein:

altering the state of the program file comprises updating the program file to a new state or reverting the program file to a prior state.

13. The method of claim 1, further comprising:

detecting a power loss event associated with the memory device, wherein detecting the power loss event indicates an additional alteration of the program file, and wherein altering the state of the program file is based at least in part on detecting the power loss event.

14. A method, comprising:

receiving, at a memory device, a command for altering a program file using a patch file and a first signature associated with the patch file, the patch file comprising a differential characteristic of the program file;

writing the patch file and the first signature to a buffer of the memory device;

authenticating the patch file using the first signature and using a second signature generated by the memory device based at least in part on writing the patch file and the first signature to the buffer; and altering a state of the program file using the patch file based at least in part on authenticating the patch file and based at least in part on detecting one or more events associated with the memory device.

15. The method of claim 14, further comprising:

generating, at the memory device, the second signature using the patch file and a cryptographic key stored by the memory device; and comparing the first signature with the second signature, wherein authenticating the patch file is based at least in part on comparing the first signature with the second signature.

16. The method of claim 14, further comprising:

receiving a third signature associated with the program file; and authenticating the program file using the third signature after altering the state of the program file using the patch file.

17. The method of claim 14, wherein:

altering the state of the program file comprises updating the program file to a new state or reverting the program file to a prior state.

18. The method of claim 14, further comprising:

generating, at the memory device, a fourth signature; and determining that the fourth signature matches a signature associated with the command, wherein the patch file is written to the buffer of the memory device based at least in part on determining that the fourth signature matches the signature associated with the command.

19. The method of claim 14, further comprising:

detecting a power loss event associated with the memory device, wherein detecting the power loss event indicates an additional alteration of the program file, and wherein altering the state of the program file is based at least in part on detecting the power loss event.

20. A memory system, comprising:

one or more memory arrays;

a buffer coupled with the one or more memory arrays;

processing circuitry coupled with the one or more memory arrays and the buffer; and instructions executable by the processing circuitry to cause the memory system to:

receive a command for altering a state of a program file using a patch file, the patch file comprising a differential characteristic of the program file;

write a first portion of the program file to the buffer, the first portion of the program file;

transition an initial state of the program file using the patch file based at least in part on writing the first portion of the program file to the buffer;

write at least a portion of a transition state of the first portion of the program file to the buffer; and alter the state of the program file based at least in part on detecting one or more events associated with the memory system.

* * * * *